US006389582B1

(12) United States Patent
Valainis et al.

(10) Patent No.: US 6,389,582 B1
(45) Date of Patent: May 14, 2002

(54) THERMAL DRIVEN PLACEMENT

(76) Inventors: John Valainis, 6750 Wisteria Way, San Jose, CA (US) 95129; Robert Mark Sumner, 1242 W. McKinley, No. 3, Sunnyvale, CA (US) 94086; Jing Chen, 38855 Litchfield Cir., Fremont, CA (US) 94536

( * ) Notice: Subject to any disclaimer, the term of this patent is extended or adjusted under 35 U.S.C. 154(b) by 0 days.

(21) Appl. No.: 08/576,634

(22) Filed: Dec. 21, 1995

(51) Int. Cl.[7] .............................................. G06F 15/60
(52) U.S. Cl. .......................... 716/9; 257/301; 257/313; 257/713; 257/714; 257/307; 257/720; 257/304; 257/903; 365/51; 365/104; 365/149; 716/18; 703/2; 165/185
(58) Field of Search .................................. 257/301, 302, 257/313, 304, 713, 714, 720, 903; 365/51, 104, 149; 716/9, 18; 703/2; 165/185

(56) References Cited

U.S. PATENT DOCUMENTS

| | | | |
|---|---|---|---|
| 4,199,772 A | * | 4/1980 | Natori et al. |
| 4,312,012 A | * | 1/1982 | Frieser et al. |
| 4,450,472 A | * | 5/1984 | Tuckerman et al. |
| 4,516,632 A | * | 5/1985 | Swift et al. |
| 4,567,505 A | * | 1/1986 | Pease et al. |
| 4,573,067 A | * | 2/1986 | Tuckerman et al. |
| 4,630,088 A | * | 12/1986 | Ogura et al. |
| 4,630,219 A | * | 12/1986 | DiGiacomo et al. |
| 4,630,237 A | * | 12/1986 | Miura et al. |
| 4,894,709 A | * | 1/1990 | Phillips et al. |
| 4,912,664 A | | 3/1990 | Weiss et al. ................. 364/577 |
| 4,914,739 A | * | 4/1990 | Malhi |
| 5,065,355 A | | 11/1991 | Hayase ........................ 395/800 |
| 5,113,404 A | * | 5/1992 | Gaebe et al. |
| 5,197,016 A | | 3/1993 | Sugimoto et al. ........... 364/490 |
| 5,264,392 A | * | 11/1993 | Gaebe et al. |
| 5,377,122 A | * | 12/1994 | Wener et al. |

OTHER PUBLICATIONS

Armor, A., and Chari, M., "Heat Flow in the Stator Core of Large Turbine–Generators, by the Method of Three–Dimensional Finite Elements (Part I: Analysis of Scalar Potential Formulation)," *IEEE Transactions of Power Apparatus and Systems*, 1976, pp. 1648–1656.

Armor, A., and Chari, M., "Heat Flow in the Stator Core of Large Turbine–Generators, by the Method of Three–Dimensional Finite Elements (Part II: Temperature Distribution in the Stator Iron)," *IEEE Transactions of Power Apparatus and Systems*, 1976, pp. 1657–1668.

Avaritsiotis, J., and Eleftheriades, G., "Layout and Thermal Analysis of Power Devices Using a PC/XT," *Active and Passive Elec. Comp.*, 1990, pp. 95–109.

Breuer, M., "A Class of Min–Cut Placement Algorithms," *IEEE Twenty–Five Years of Electronic Design Automation: A Compendium of Papers from the Design Automation Conference*, pp. 142–148.

Cahlon, B., et al., "A Model for the Convective Cooling of Electronic Components with Application to Optimal Placement," *Mathl Comput. Modelling*, 1991, pp. 59–75.

(List continued on next page.)

Primary Examiner—William A. Cuchlinski, Jr.
Assistant Examiner—Marc McDieunel
(74) Attorney, Agent, or Firm—Klarquist Sparkman, LLP (57) ABSTRACT

A method for thermal driven placement begins by first computing thermal response functions for individual components for several locations on a placement surface as a preprocessing step to placement. The thermal response functions can then be used to compute junction temperatures of components quickly and accurately during placement of the components in a layout. For a given component location, the component's junction temperature is computed by summing the contributions of neighboring components with the component's own contribution. The difference between predefined junction temperatures for the components and the calculated junction temperatures can then be used to assess the merits of the placement.

20 Claims, 7 Drawing Sheets

OTHER PUBLICATIONS

Casselman, G., and De Mey, G., "A Thermal Model for Hybrid Circuits," *Hybrid Circuits,* 1986, pp. 9–13.

Cheng, C., "Linear Placement Algorithms and Applications to VLSI Design," *Networks,* 1987, pp. 439–464.

Chu, R., and Simons, R., "Review of Thermal Design for Multi–Chip Modules," pp. 1633–1642.

Chung, H., and Burnside, W., "An Airborne Adaptive Array Element Placement Algorithm," *IEEE Antennas and Propagation,* 1985, pp. 249–252.

Coulomb, J., et al., "A Finite Element Package for Magnetic Computation," *IEEE Transactions on Magnetics,* 1985, pp. 2499–2502.

Danil'chenko, N., and Raikhel, I., "An Adaptive Algorithm for Placement of Objects in a Computer Network," *Avotmatika i Vychislitel'naya Tekhnika,* 1987, pp. 20–23.

De Mey, G., and Van Schoor, L., "Thermal Analysis of Hybrid Circuits with Mounted Components," *Hybrid Circuits,* 1988, pp. 28–32.

De Mey, G., et al., "Thermal Studies on Hybrid Circuits," *Hybrid Circuits,* 1988, pp. 8–11.

Demmin, J., "Thermal Modeling of Multi–Chip Modules," pp. 1145–1154.

Dolbear, T., "Thermal Management of Multichip Modules," *Electronics Packaging & Production,* 1992, pp. 60–63.

Driscart, M., and De Mey, G., "The Boundary Element Method for Thermal Analysis of Electronic Equipment in a Multi–Dimensional Environment," pp. 343–354.

Estes, R., "Thermal Design Considerations for COB Applications," *Hybrid Circuits,* 1988, pp. 49–55.

Fu, S., and Yang, C., "A Computer–Aided Layout System for Multilayered Hybrid Circuits," pp. 118–122.

Fukuoka, Y., and Ishizuka, M., "An Application of the Thermal Network Method to the Thermal Analysis of Multichip Packages (Proposal of a Simple Thermal Analysis Model)" *Japanese Journal of Applied Physics,* 1989, pp. 1578–1585.

Fukuoka, Y., and Ishizuka, M., "Transient Temperature Rise for Multi–Chip Packages," *Hybrid Circuits,* 1983, pp. 52–57.

Kirkpatrick, S., et al., "Optimization by Simulated Annealing," *Science,* 1983, pp. 671–680.

Kovacs, A., and Reaves, P., "Thermal Performance of Multichip Modules," ISHM '91 Proceedings, 1991, pp. 17–21.

Kozawa, T., et al., "Automatic Placement Algorithms for High Packing density V L S I," IEEE 20th Design Automation Conference, 1983, pp. 175–181.

Lauther, U., "A Min–Cut Placement Algorithm for General Cell Assemblies Based on a Graph Representation," IEEE Twenty–Five Years of Electronic Design Automation: A Compendium of Papers from the Design Automation Conference, pp. 182–191.

Preas., B., and VanCleemput, W., "Placement Algorithms for Arbitrarily Shaped Blocks," *IEEE,* pp. 199–205.

Razaz, M., and Gan, J., "Fuzzy Set Based Initial Placement for IC Layout," *IEEE,* 1990, pp. 655–659.

Reed, D., and Gartner, B., "Thermal Modeling of Hybrid Microelectronics," *IEEE,* 1988, pp. 235–239.

Rottiers, L., and De Mey, G., "An Automatic Placement Algorithm for Optimising Thermal Behaviour of Hybrid Circuits," EMC '87: Proceedings European Microelectronics Conference, 1987, pp. 325–331.

Rottiers, L., and De Mey, G., "Hot Spot Effects in Hybrid Circuits," *IEEE Transactions on Components, Hybrids, and Manufacturing Technology,* 1988, pp. 274–278.

Schweikert, D., "A 2–dimensional Placement Algorithm for the Layout of Electrical Circuits," IEEE Twenty–Five Years of Electronic Design Automation: A Compendium of Papers from the Design Automation Conference, pp. 102–110.

Sha, L., and Dutton, R., "An Analytical Algorithm for Placement of Arbitrarily Sized Rectangular Blocks," IEEE 22nd Design Automation Conference, 1985, pp. 602–608.

Siarry, P., et al., "Thermodynamic Optimization of Block Placement," *IEEE Transactions on Computer–Aided Design,* 1987, pp. 211–221.

Tkatchenko, S., and Koval, V., "The Optimization of Temperature Regime in Radioelectronic Devices When Solving Placement Problems," pp. 46–48.

\* cited by examiner

THERMAL DRIVEN PLACEMENT

FIELD OF THE INVENTION

The invention relates to computer-assisted design of electronic circuits, and more specifically relates to computer-assisted placement of components based on thermal constraints.

BACKGROUND OF THE INVENTION

In modern electronic circuit fabrication, electrical components such as semiconductor devices are mounted on printed circuit boards ("PCB"), and more recently, within multi-chip modules ("MCM"). In printed circuit board technology, semiconductor devices or "dies" are each separately encased in a package, such as the dual in line package ("DIP"), having pin connectors extending from the package for physically mounting the component to a circuit board. Multi-chip module or MCM technology further minimizes space consumption by placing several dies on a single substrate within a package enclosing all of the dies. In both technologies, the components of a circuit are interconnected through a series of conductive traces called interconnects. The placement of components on a substrate or PCB and the routing of interconnects among these components is referred to as the "layout" of the circuit design.

The design of circuit layouts in printed circuit board and multi-chip module technology is a complex problem due to the numerous and often conflicting performance goals. In designing a circuit layout, the objective is to place components and route interconnects among them such that timing, electrical, and thermal performance goals are satisfied. Computer-assisted design tools help simplify the design task, but they typically only focus on a small part of the layout problem in isolation. For example, there are separate tools to perform timing, electrical, and thermal analysis on a layout, but these tools are not sufficiently integrated with other tools such as routers and placement programs that create the layout. As a result, a designer typically has to create a number of alternative layouts, in a trial and error fashion, until all of the performance goals are satisfied.

Achieving all of the performance goals is frustrated by conflicting design constraints. For example, placement of components based on electrical and timing constraints conflicts with placement based on thermal constraints. The designer must place components as close together as possible to minimize electrical signal delays. However, to minimize thermal interaction among components, the designer must space the components sufficiently apart or provide various cooling techniques such as introducing thermal vias to remove heat.

Present placement programs known to the inventors do not adequately address the problem of thermal interaction among components. There is a need, therefore, to provide a placement system that incorporates a detailed analysis of a component's behavior into the placement of the components in a circuit layout.

Circuit designers use placement programs to optimize placement of components in a circuit layout. Such programs employ placement algorithms that seek to provide the best placement for a given number of circuit components. There are a variety of different placement algorithms. In general, placement algorithms attempt to minimize a figure of merit in an attempt to find an optimal placement. The figure of merit can be, for example, the number of nets crossing a predetermined number of cut-lines on the board, the total Manhattan length (the sum of half-perimeter bounding boxes of all nets), or the sum of the distance from all net centroids. Given a figure of merit, there are a number of strategies to minimize it, including using a random initial placement followed by pair-wise swapping, simulated annealing, or greedy methods such as a constructive method. There are a variety of placement algorithms, but none have successfully integrated an accurate thermal analysis.

While thermal analysis tools exist, they have not been successfully used during placement because of their very large computation requirements. Sophisticated thermal analysis programs exist, such as AutoTherm, commercially available from Mentor Graphics, Corp., that provide a very accurate thermal picture of a PCB or MCM design layout. As in sophisticated thermal analysis products like AutoTherm, a detailed thermal analysis takes into account several thermal characteristics such as heat transfer to a substrate in MCM technology, heat transfer through a molding compound, and heat transfer through a bond to name a few. Thermal analysis of this caliber has not been integrated into the placement process because the computational time required to analyze a particular layout makes a thermal analysis completely unacceptable during the placement process.

One approach for integrating thermal analysis in placement without substantially sacrificing speed is described in co-pending U.S. patent application Ser. No. 08/069,148, entitled Method and System for Integrating Component Analysis with Multiple Component Placement. This approach includes performing a thermal analysis of each individual component and then deriving a thermal placement length for the component from this analysis. The thermal placement lengths for components in a design can then be used as placement constraints in an automatic or interactive placement program. This approach is an alternative advantageous method for integrating thermal design considerations into placement. However, this approach is less accurate in some cases because it does not take into account the thermal contribution from surrounding components. In addition, the thermal placement length tends to be an overly conservative constraint on placement.

There is a need therefor for an improved method of integrating thermal analysis with placement.

SUMMARY OF THE INVENTION

The invention provides an improved method of integrating thermal analysis with placement. In one embodiment of the invention, thermal response data is computed for components individually on the placement surface and also for a number of locations on the placement surface. During placement of components on the layout, the thermal response data can be used to determine whether a placement meets predefined thermal constraints such as maximum junction temperatures for the components. If the placement satisfies predefined thermal constraints, then it can be used as a potential placement for a design. Otherwise, one or more components can be moved and the placement checked again to determine whether thermal constraints are satisfied.

Since the thermal response data is already computed, the thermal analysis of a given placement can be performed quickly and accurately during placement. In one embodiment, the junction temperature of a component can be computed by summing the contribution of other neighboring components with the component's own temperature. The thermal response data, such as a temperature distribution, provides temperature values and corresponding coordinates for the temperature values. To support rapid analysis during placement, the thermal response data can be represented in data structures that support searching of the thermal response data and computing a thermal contribution from a neighboring component. The placement can be changed depending on whether placement of a component exceeds its maximum junction temperature. Also, the thermal cost of a placement can be evaluated based on how close each component is to its maximum junction temperature.

In addition to the features outlined above, embodiments of the invention can include a number of different features. To minimize storage requirements, the thermal response data that needs to be stored can be reduced by computing a thermal response within the placement surface and applying it to a variety of locations by shifting the data. During placement, the thermal analysis can be calculated quickly by analyzing only the components that changed position. The range of affect for a component can be confined to an area or "neighborhood" less than the entire placement surface. As such, when this component is moved only the components in its original neighborhood, as well as components in its new neighborhood need to be analyzed. A variety of other alternatives are possible and will become apparent from the following description and accompanying drawings.

DETAILED DESCRIPTION

Figure 1:
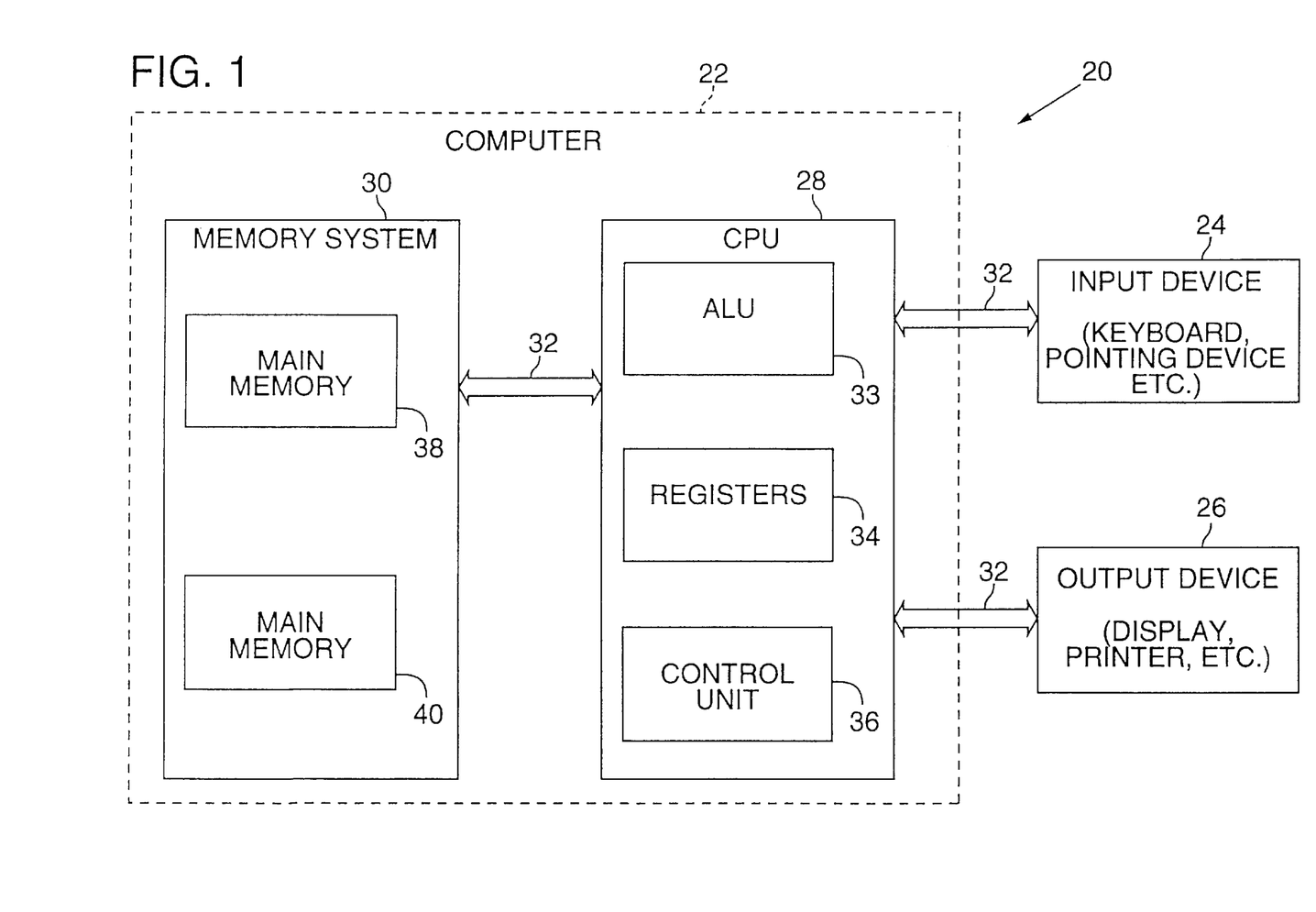
FIG. 1 is a block diagram of a computer system, which serves as an operating environment for an embodiment of the invention.

FIG. 1 is a block diagram illustrating a computer system 20, which serves as an operating environment for an embodiment of the invention. Computer system 20 includes as its basic elements a computer 22, input device 24 and output device 26.

Computer 22 generally includes at least one high speed processing unit (CPU) 28 and a memory system 30 that communicate through a bus structure 32. CPU 28 includes an arithmetic logic unit (ALU) 33 for performing computations, registers 34 for temporary storage of data and instructions and a control unit 36 for controlling the operation of computer system 20 in response to instructions from a computer program such as an application or an operating system.

Memory system 30 generally includes high-speed main memory 38 in the form of a medium such as random access memory (RAM) and read only memory (ROM) semiconductor devices and secondary storage 40 in the form of a medium such as floppy disks, hard disks, tape, CD-ROM, etc. and other devices that use electrical, magnetic, optical or other recording material. Main memory 38 stores programs such as a computer's operating system and currently running application programs. Main memory 38 also includes video display memory for displaying images through a display device.

Input device 24 and output device 26 are typically peripheral devices connected by bus structure 32 to computer 22. Input device 24 may be a keyboard, modem, pointing device, pen, or other device for providing input data to the computer. Output device 26 may be a display device, modem, printer, sound device or other device for providing output data from the computer.

An embodiment of the invention is described below with reference to symbolic representations of instructions that are performed by a computer system 20. These instructions are sometimes referred to as being computer-executed. The invention can be implemented in a program or programs, comprising a series of instructions stored on a computer-readable medium. The computer-readable medium can be any of the devices, or a combination of the devices, described above in connection with memory system 30.

An operating system, stored in memory of the computer system, can provide a number of low level functions to support the operation of an embodiment of the invention. In general, the operating system is responsible for controlling the allocation and usage of a hardware resources such as memory, CPU time, disk space, and peripheral devices. As is well-known, operating systems provide such low level functions as module (process and dynamic link library) management, scheduling, interprocess messaging, memory management, file system management, and graphical user interface support.

It should be understood that FIG. 1 is a block diagram illustrating the basic elements of a computer system; the figure is not intended to illustrate a specific architecture for a computer system 20. For example, no particular bus structure is shown because various bus structures known in the field of computer design may be used to interconnect the elements of the computer system in a number of ways, as desired. CPU 28 may be comprised of a discrete ALU 33, registers 34 and control unit 36 or may be a single device in which one or more of these parts of the CPU are integrated together, such as in a microprocessor. Moreover, the number and arrangement of the elements of the computer system may be varied from what is shown and described in ways known in the art.

The method for thermal driven placement designed according to the invention can be implemented in any of a number of well-known computer systems. An embodiment of the invention is ported to Sun Workstations for the Sun OS and Solaris Operating Systems, and to the Hewlett-Packard PA-RISC workstation. In addition, to these specific platforms, alternative embodiments can be ported to a variety of UNIX workstations. Similarly, they can be ported to personal computers (PC), such as IBM-AT compatible computers or computer systems based on the 80386, 80486, or Pentium processors from Intel Corporation. The above systems serve as examples only and should not be construed as limiting the type of computer system in which the invention may be implemented.

The preferred embodiment of the invention is implemented as part of a layout system, which integrates thermal analysis with interactive and automatic placement of components. Interactive placement enables a user to place components in a graphical representation of a layout on a display screen. Thermal analysis is "integrated" with interactive placement because a thermal engine performs a fast thermal analysis for a given placement as the user places components. Similarly, thermal analysis is integrated with automatic placement because the thermal engine performs a thermal analysis for potential placements during the placement process.

To be effective in the context of interactive and automatic placement, the thermal analysis must be fast and accurate. In this embodiment, the thermal engine performs a fast and accurate thermal analysis by using thermal response function data, computed before placement begins, to determine whether a potential placement violates thermal design constraints during placement. The maximum junction temperature of a component serves as a thermal design constraint in one implementation. The thermal engine computes the junction temperature for components during placement, and compares the junction temperatures with the maximum junction temperature for the respective components. If the sum of a component's own thermal contribution and the contribution of other neighboring components exceed this maximum temperature, then the component or its neighbors should be moved, or thermal vias added to lower the junction temperature.

There are a number of possible alternatives to using a single function temperature for each component. For instance, more than one temperature can be assigned to a component that reflects manufacturing variation or a minimum temperature. A range of temperatures can also be used for each component. As such, it should be understood that the scope of the invention is not limited to an embodiment which uses a single maximum junction temperature.

During automatic placement, an optimal placement relative to thermal constraints can be found by determining how close the junction temperatures of components are to their respective maximum junction temperatures. The closer a component is to its maximum junction temperature, the higher the thermal "cost" associated with a particular placement of components. A thermal cost is a number used to determine the merits of a given placement. For example, if the junction temperature of a component is less than half its maximum junction temperature, it can be assigned a thermal cost of zero. The thermal cost increases as the junction temperature for a component approaches its maximum junction temperature. As the junction temperature rises above the maximum junction temperature, the thermal cost increases still further. The maximum junction temperature is the maximum temperature for the correct functioning of the component. It is possible however, that the junction temperature may exceed its maximum junction temperature for a particular placement configuration during automatic placement. The placement of one or more components can be swapped, and new placements analyzed, until the thermal cost for the design is minimized or below a predefined value.

While there are a number of possible variations to the approach outlined above, the method generally includes quickly computing the expected temperature of every component ("die") of a given placement. A placement routine can then take this data and determine the costs of these temperatures relative to parameters defined for the dies. The placement routine then determines how well a given placement satisfies the thermal requirements of the design.

Using this approach, an embodiment of the invention can provide fast and accurate thermal driven placement. The structure and operation of an embodiment of the invention is described in further detail below.

Figure 2:
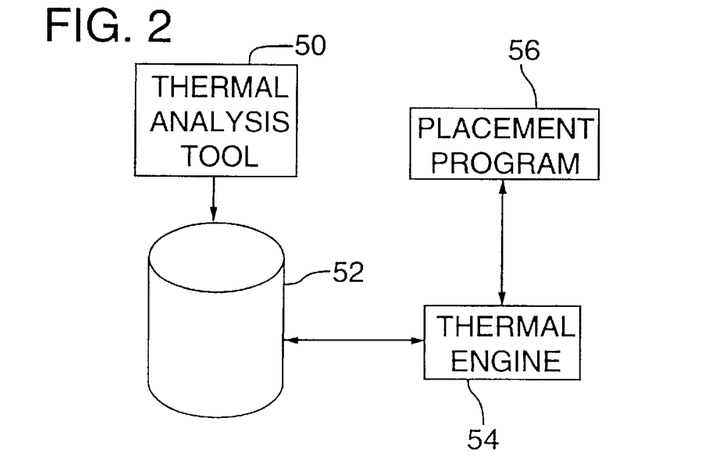
FIG. 2 is a block diagram illustrating the architecture of an embodiment of the invention.

FIG. 2 is a block diagram illustrating the architecture of an embodiment of the invention. As a preprocessing step, the thermal analysis tool 50 calculates the thermal response function for a component on a placement surface such as a printed circuit board or a substrate in a multi-chip module (MCM). Analyzing one component at a time, the thermal analysis tool 50 generates a thermal response of a component for several locations on the placement surface. The response data can then be used to perform a thermal analysis for a variety of alternative placements of the components on the placement surface.

In this embodiment, one exemplary thermal analysis tool 50 is the AUTOTHERM® tool from Mentor Graphics Corporation of Wilsonville, Oreg. Another exemplary thermal analysis tool is the Thermax thermal analysis tool from Cadence Design Systems of San Jose, Calif. The thermal analysis tool performs a finite element analysis for a design and writes thermal response data to a file. The thermal response data includes temperature distribution for a component at several locations on the placement surface. The temperature distribution is represented by a list of data points or nodes, each specifying a temperature value at an associated node. When the temperature distribution changes rapidly, for example, data points are located closely together to reflect the changes in the temperature distribution curve. Conversely, when the temperature distribution changes less rapidly, fewer data points are necessary to represent the temperature distribution.

Using the temperature distribution generated by thermal analysis tool 50, the temperature at a point relative to the location of the component, which acts as a heat source, can be found directly if the point is stored in the file or indirectly through interpolation among data points in the file. The temperature distribution data is stored in a design database 52 accessible to the thermal engine 54 so that it may be used in thermal driven placement.

The thermal engine 54 performs a thermal analysis of a design for a given placement. The thermal engine reads the thermal response data from files generated by the thermal analysis tool and initializes it for use during placement. During placement, the placement program 56 calls the thermal engine to determine whether a given placement satisfies thermal design constraints. These constraints may include the maximum junction temperature for components in the design, and the total thermal cost computed by summing the thermal cost of components in the design. More detail on the routines for implementing the thermal engine are described below.

The placement program 56 places components in a layout based on a number of design constraints including the thermal constraints discussed above. The method for integrating thermal analysis in placement in this embodiment can be adapted to a variety of placement programs. The placement program used in this embodiment represents the placement as a slicing tree using Simulated Annealing as its optimization method. A variety of other optimization strategies may also be used as alternatives. For example, the placement engine could use a randomized greedy method, or a branch and bound method.

The thermal engine can invoke the thermal analysis tool 50 to obtain temperature data on a per part basis. The thermal engine supplies thermal analysis tool 50 with the design parameters for the parts in a design so that it can compute response function data on a per part basis. The thermal engine can then use this response function data when called by the placement engine to compute die junction temperatures.

To initiate placement, the user can invoke either interactive or automatic placement processes as supported in the placement engine. The placement engine receives thermal design constraint data from the thermal engine, and it does not need to be involved in the calculation of die junction temperatures.

The method for integrating thermal analysis in placement is implemented in the layout system illustrated in FIG. 2. Having outlined the architecture of this system, we now describe the structure and operation of an embodiment in more detail.

The first step of the process is to find the thermal response function for components in a design for several locations on the placement surface. The response function is the temperature distribution on the placement surface generated by a unit source of heat. The concept of a thermal response function for a placement surface can be illustrated with the ideal case where the heat source is a point source and the thermal response is represented by the Green's function of heat conduction with the appropriate boundary conditions. In order to compute junction temperatures accurately for the approach described below, these boundary conditions should be homogenous in the difference between the temperature and ambient temperature. Since the boundary conditions are homogenous in the case of thermal analyses of MCM's and PCB's, the thermal response data can be used to make an accurate thermal analysis during placement.

To illustrate Green's Functions, we provide the following explanation. The equation of heat conduction in a structure with thermal conductivity $\tau(\bar{x})$ at position $\bar{x}$ is given by $$-\nabla \cdot (\tau(\bar{x}) \nabla T(\bar{x})) = s(\bar{x}) \quad (1)$$

Here $T(\bar{x})$ is the temperature at position $\bar{x}$ and $s(\bar{x})d^3x$ is the heat generated per unit time in the infinitesimal volume $d^3x$ about $\bar{x}$. A Green's Function of the above equation is a solution of the particular case that the right hand side is equal to a Dirac delta function. That is, we have $s(\bar{x})=\delta^3(\bar{x}-\bar{x}o)$. This represents a point heat source of unit strength located at $\bar{x}o$. Thus the Green's Function satisfies the equation $$-\nabla \cdot (\tau(\bar{x}) \nabla G(\bar{x}, \bar{x}o)) = \delta^3(\bar{x}-\bar{x}o) \quad (2)$$

$G(\bar{x}-\bar{x}o)$ is the temperature at $\bar{x}$ when the point heat source of unit strength is located at $\bar{x}o$. If $G(\bar{x}-\bar{x}o)$ satisfies the correct boundary conditions, then the solution of Equation 1 may be expressed as $$T(\bar{x}) = \int G(\bar{x}-\bar{x}o)s(\bar{x}o) \, d^3xo \quad (3)$$

Thus, for an arbitrary heat source, the Green's Function lets us express the temperature distribution as an integral over the heat source.

Suppose a chip located at $\bar{x}o$ generates heat $c(\bar{x}-\bar{x}o)$ at position x. The contribution of this chip to the temperature at the point $\bar{y}$ is given by $$T(\bar{y}, \bar{x}o) = \int G(\bar{y}, \bar{x})c(\bar{x}-\bar{x}o) \, d^3x \quad (4)$$

$T(\bar{y}, \bar{x}o)$ is the temperature response at $\bar{y}$ due to the chip located at $\bar{x}o$. It is the functions $T(\bar{y}, \bar{x}o)$ which are used in our method and referred to as response functions. It is these functions which the thermal analysis tool 50 computes. The chips are specified to be at various positions in the thermal analysis tool and the temperature distributions are calculated. This data directly gives the response functions.

The use of a thermal response can be extended to designs where non-linear boundary conditions exist, such as in the case of radiative boundary conditions. In these cases, the thermal response function can be linearized around a reference solution computed using the total power dissipated by all of the components in the design.

To provide a more accurate response function, a rectangular heat source, rather than a point source, can be used to simulate the thermal response of a component. A square heat source, for example, can be used to approximate the thermal response of a component. In addition, a response function can be computed for varying source sizes and aspect ratios. Using these response functions as a starting point, additional response functions can be generated for components of varying sizes by interpolation.

Additional approximations can be made to simplify the thermal analysis during placement. For example, the heat sources can be considered to be located on the placement surface.

Figure 3:
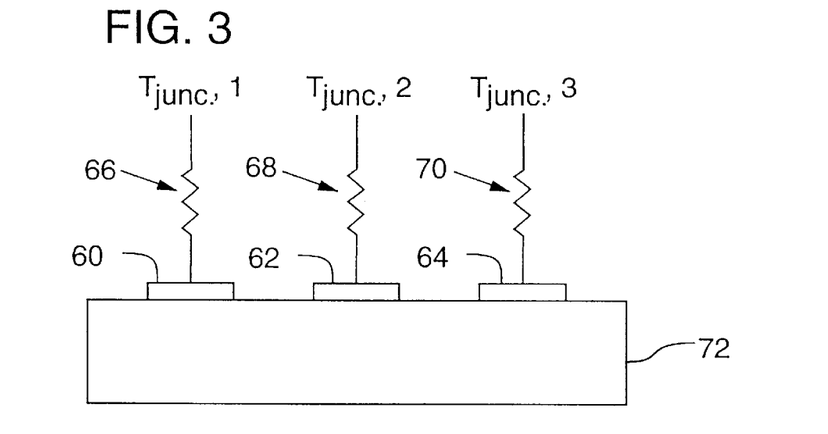
FIG. 3 illustrates an example of how components can be modeled as thermal resistors.

In one implementation, the thermal analysis tool models thermal Conduction through the substrate. For example, it models the thermal conduction in the MCM substrate. Components can be modeled as thermal resistors connected to the substrate. FIG. 3 illustrates an example of how components 60, 62, 64 can be modeled as thermal resistors 66, 68, 70. For simplicity, this example only has three components 66-70 located on the surface of a substrate 72. In contrast, a typical design can have many more components. A component is modeled as a thermal resistor having a resistance based on the characteristics of the component and its environment. The value of the resistance depends on the thermal characteristics of the component, substrate, and the adhesive joining the component to the substrate. Thermal vias through the placement surface also affect the value of thermal resistance.

The thermal analysis tool can model radiation and convection by properly setting the boundary conditions. For example, in an MCM any radiation that exists will be at the outer boundaries of the package. The effect of radiation can be incorporated into the analysis by setting up the boundary conditions for the package. The process for setting up the boundary conditions generally includes calculating the entire power dissipated within the MCM and then approximating the amount of radiation that this amount of power would generate at the surface of the MCM. Since radiation is not a linear physical effect, it cannot be modeled directly using this method. Likewise, any convection flowing over an MCM package will only affect the boundary conditions on the surfaces of the MCM package. The affect of convection can be accounted for by adjusting the boundary conditions as well.

In one implementation, the heat dissipated by a component is assumed to be uniform across the area occupied by it on the placement surface. While this assumption simplifies the thermal model of a component, it is not required for a working embodiment of the invention.

With the thermal model described above, the junction temperature for a component on the substrate can be computed by summing the contribution of other components and the component's own contribution. The contribution of another component is determined by examining its response function for its location on the placement surface and finding the temperature at the location of the component of interest.

The closest neighbors of a component usually have the most significant contribution to the junction temperature of the component. The component's own contribution is determined from the response function for the component at its present location.

The contributions from some components can be disregarded where they fall below a predefined nominal value. The point at which a component has negligible thermal interaction with a neighboring component can vary. In some cases, the thermal response function decays exponentially with distance from a component. However, this is not necessarily true in all cases.

In one implementation, the neighborhood of a component can be determined by deriving a characteristic length from the response function. In a case where the response function decays exponentially, the response function decays by a factor of 100 in a distance of five characteristic lengths from the component. As such, the characteristic length can be used to determine in which areas a component will no longer have significant thermal interactivity with neighboring components.

In an alternative implementation, the thermal engine examines the response function and finds where the value of the response function has fallen sufficiently such that it can be assumed to be zero.

The "neighborhood" of a component defines a boundary indicating the extent to which a first component will significantly thermally interact with its neighbors. If a component is moved from a first location to a second one, the junction temperature for components in the neighborhoods for the first and second location is recomputed. In addition, the junction temperature for the moved component is recomputed.

Confining the thermal response function data to a neighborhood reduces processing time and the memory space needed to store the data. The neighborhood reduces processing time because it reduces the number of junction temperatures that need to be recomputed for a change in the placement of components. It also reduces memory requirements because thermal response data need only be saved for an area covering the neighborhood.

Memory requirements can be reduced further by taking advantage of the symmetry of the placement surface and by shifting thermal response data across the surface. For all locations where the neighborhood of the component is within the placement surface, one response function can represent several other response functions. The response functions for other locations can be found by shifting the single response function data. Other response functions should be computed to model the thermal response at the placement surface's edge. If the placement surface is rectangular, or has some other shape with symmetrical regions, the amount of memory consumed by thermal response data can be used by storing one thermal response for symmetrical regions and shifting and/or rotating the data as necessary to accurately model the thermal response on the surface.

Figure 4:
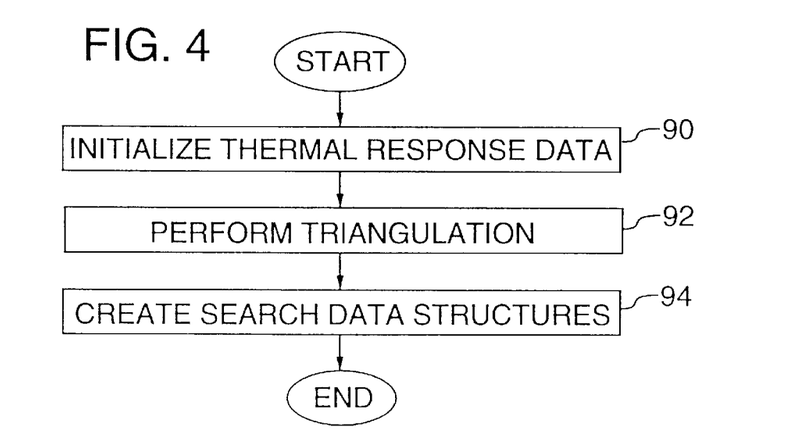
FIG. 4 is a flow diagram of steps performed by the thermal engine to prepare thermal response data for placement.

FIG. 4 is a flow diagram of steps performed by the thermal engine before placement begins. The thermal engine initializes the data created by the detailed thermal analysis tool and creates data structures to allow for fast searching and manipulation of the thermal data during placement.

The thermal analysis tool 50 (FIG. 2) may generate thermal response data which includes a temperature response function in the form of a list of temperature values for nodes on the placement surface. This temperature response data is stored in a file or files for each of the unique components in a design, and can include response data for different locations of these components on the placement surface. In one implementation, temperature response functions for all components in a design are stored in a single file. However, the implementation can vary.

The number of locations for which a temperature response function is computed depends on a number of different factors including the geometry of the placement surface and the degree of desired accuracy of the thermal analysis during placement. As set forth above, if the placement surface is flat and rectangular, the temperature response functions can be computed for a number of representative locations and then this data can then be shifted to approximate the temperature response at other locations. The thermal response function data is stored on a PART basis in this implementation. For example, 6 dies could be on an MCM that all are electrically equivalent. Only one set of response function data would be necessary for these 6 dies.

In addition to the temperature response data, additional data relevant to thermal analysis is also stored in the design database so that the thermal engine can access it during placement. This data includes the ambient temperature used in computing the temperature response function, the units of the temperature data, the name or identification of the part, and the location and orientation of the part.

As a first step 90, the thermal engine loads the thermal response data from the files generated by the thermal analysis tool 50. The initializing step may include performing a parser analysis for the temperature response function file, and storing the temperature response data of the parts as well as additional data. After this step, the temperature response data is ready to be used by the thermal engine.

It is not necessary that all of the temperature values be used from each temperature response function. The temperature response function can be confined to an area defined by a part's neighborhood. One way to eliminate thermal response data outside the neighborhood occurs as follows. A neighborhood or range, such as a rectangular range, can be defined by looking at the values of the response function at increasing distances from the component. Points can then be selected along the boundary of the range as nodes of the temperature response function. For points on this boundary whose temperature are unknown, temperature can be obtained by interpolating temperature values from neighboring nodes. A triangulation can then be performed within this range.

The next step 92 is to perform a triangulation of the thermal response data. Triangulation refers to the process of finding line segments between each node and its closest neighboring nodes. The end result is several triangular elements formed by the segments between the nodes.

In this exemplary embodiment, a Delaunay triangulation is performed based on a corresponding Voronoi diagram. One approach for processing of Voronoi diagram is described in: S. Fortune, "Sweep Line Algorithm For Voronoi Diagrams", Algorithmica 2:153–174 (1987). A Voronoi diagram for a set of N points in a plane is a partition of a plane into regions, where each region contains exactly one point in S, such that for each point P, every point within its corresponding region is closer to P than to any other point of S. The Delaunay triangulation of S is the straight-line dual of the Voronoi diagram of S. The Delaunay triangulation connects points of S if and only if they are neighbors in the Voronoi diagram. Voronoi diagrams and Delaunay triangulations are well-known in computational geometry, and can be implemented in a number of alternative ways.

The Delaunay triangulation enables the thermal engine to perform efficient searches of the thermal response data. For instance, to find the temperature of a point in the thermal response data, the triangular element containing the point can be found, and then the temperature at the point can be approximated using the temperature at the nodes of the triangular element. As an alternative to a triangulation, a temperature response function can be processed and stored in other formats that support fast searches.

As shown in the next step 94 of FIG. 4, data structures are created to represent the triangulated thermal response functions. In this embodiment, a data structure is constructed for "search segments" in a temperature response function. A search segment comprises three nodes of a temperature response function. These three nodes are the nodes of a triangular element, where two nodes are the end nodes of the segment, and the other node is the node above the segment if the segment is the side of two neighboring triangular elements. Finding a triangular element containing a point is referred to as a planar point location problem. The point location problem can be solved according to the following steps: 1) preprocess a set of straight-line segments into a data structure so that for any given point, the segment directly below the point can be determined quickly.

In this embodiment, the search segments are placed into a query data structure and sorted along the horizontal direction and vertical direction so that the segment right below a point can be found quickly. Once the segment below a point is found, the three nodes in the triangular element containing this point are also found. Using this approach, the thermal engine can quickly find where an arbitrary point falls within a temperature response function.

After initializing the thermal response data such as set forth above, the thermal engine is ready to perform thermal analysis during placement.

Figure 5:
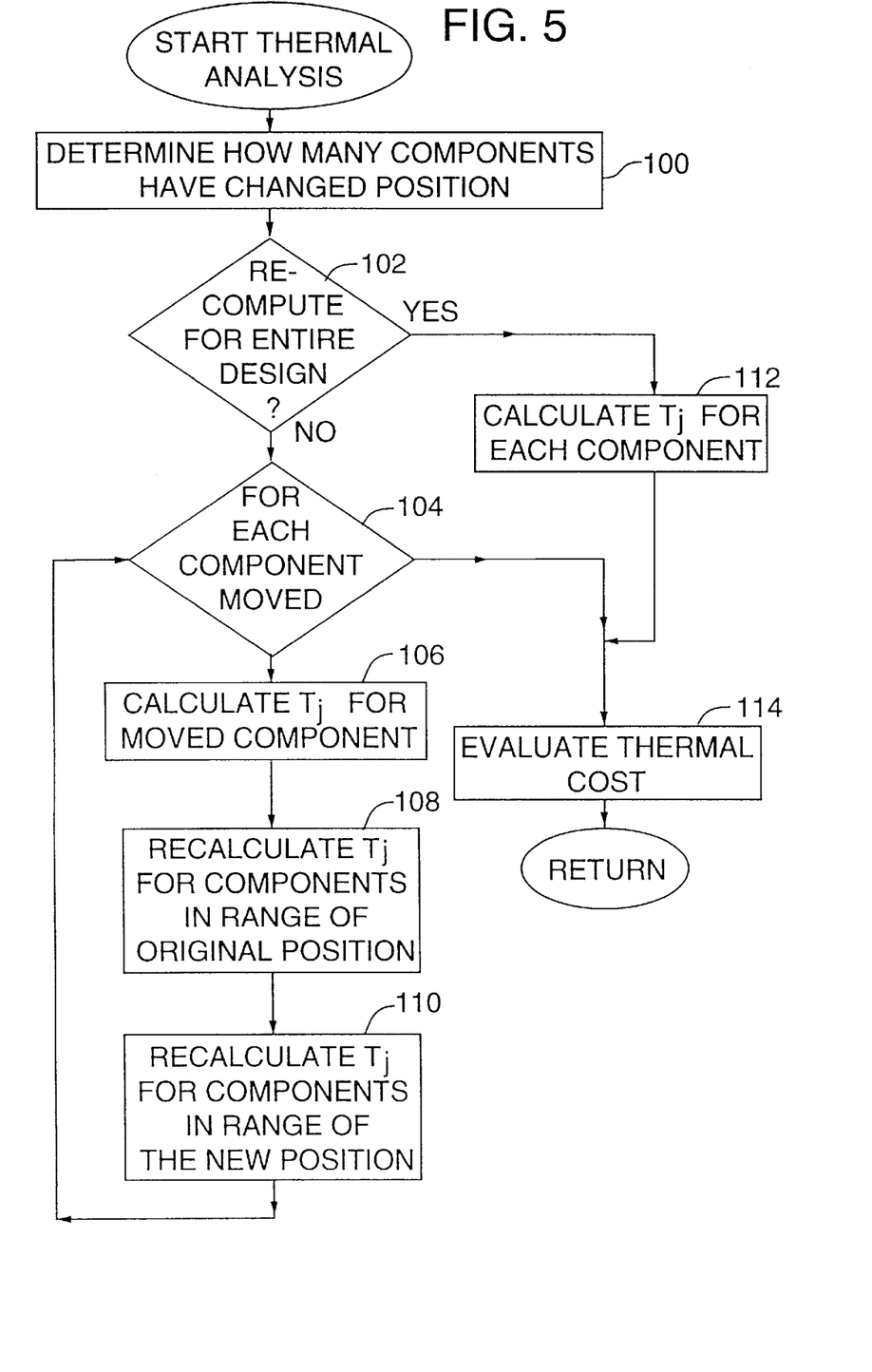
FIG. 5 is a flow diagram illustrating how thermal analysis is performed during placement in an embodiment of the invention.

FIG. 5 is a flow diagram illustrating how thermal analysis is performed during placement in an embodiment of the invention. This diagram generally depicts how the thermal engine performs thermal analysis when called from the placement program. When the placement program has found a possible placement for components in a design, it can call the thermal engine to determine whether the possible placement satisfies the design constraints.

In this embodiment, the first step is to determine whether junction temperatures need to be computed for the entire design, or only for components affected by a move of one or more components. This depends on the number of components that have changed position since the last time the thermal engine performed a thermal analysis. In step 100, the thermal engine checks how many components have changed position. The thermal engine determines how many components have changed position by counting the number of marked components, A component is "marked" when moved during placement.

The status of a component can be maintained by marking a component with a "dirty" bit. If the dirty bit is set, then a change in placement has occurred that requires the junction temperature for the component to be rechecked. This change can include movement of the component, or a move of another component closer to it or farther away. Other changes affecting the thermal analysis can include the addition of thermal vias.

Thermal vias at or beneath a component can be considered as additional components. The temperature contribution of thermal vias to other components can be calculated using thermal via models. Like components, the neighborhood or range of impact of a thermal via can be computed based on the thermal response of a thermal via. The effect of the thermal via can then be limited to components that lie within its range.

Decision step 102 represents the determination whether the junction temperature for the entire design or only those components impacted by a change in placement should be computed. The number of components affected by a change in placement can be measured by counting components with the dirty bit set as described above. The number of "dirty" components causing the path to step 112 to be followed can vary. The number of components should be chosen so that processing is minimized. In many cases, a change in placement affects only a few components, so processing can be minimized by making an incremental calculation, which includes identifying and analyzing components affected by a change in the layout (106–110). When many components are affected, however, it can be more efficient to choose step 112. It can be faster to recompute the junction temperatures for each component in the design rather than identifying each component that should be analyzed and then computing the junction temperatures for each of these components.

The steps 104–110 represent the incremental calculation, while step 112 represents the calculation of the junction temperature for each component. For an initial placement, the junction temperature for each component (where thermal characteristics are relevant) is computed. Thereafter, the incremental calculation can be made to reduce processing time during the placement process.

The incremental calculation involves an iterative process for each component moved (104). For a particular component moved during the placement process, the junction temperature for the moved component is calculated (106). The junction temperature for the components in the original range and in the new range of the moved component are recalculated (108, 110). After completing these calculations for components moved during placement, the thermal cost is evaluated as shown in step 114.

If the thermal engine determines that the junction temperatures should be computed for the entire design, processing proceeds along the path to step 112 in FIG. 5. To calculate the junction temperature for each component in the design, the thermal engine sums the contribution of neighboring components with a component's own thermal contribution. In this embodiment, the calculation of the contribution from neighboring components can be represented in three steps: 1) a search to determine which components are affected by a component; 2) a determination of the contribution to one or more neighboring components that are affected by it; and 3) a summation of these contributions.

Figure 6:
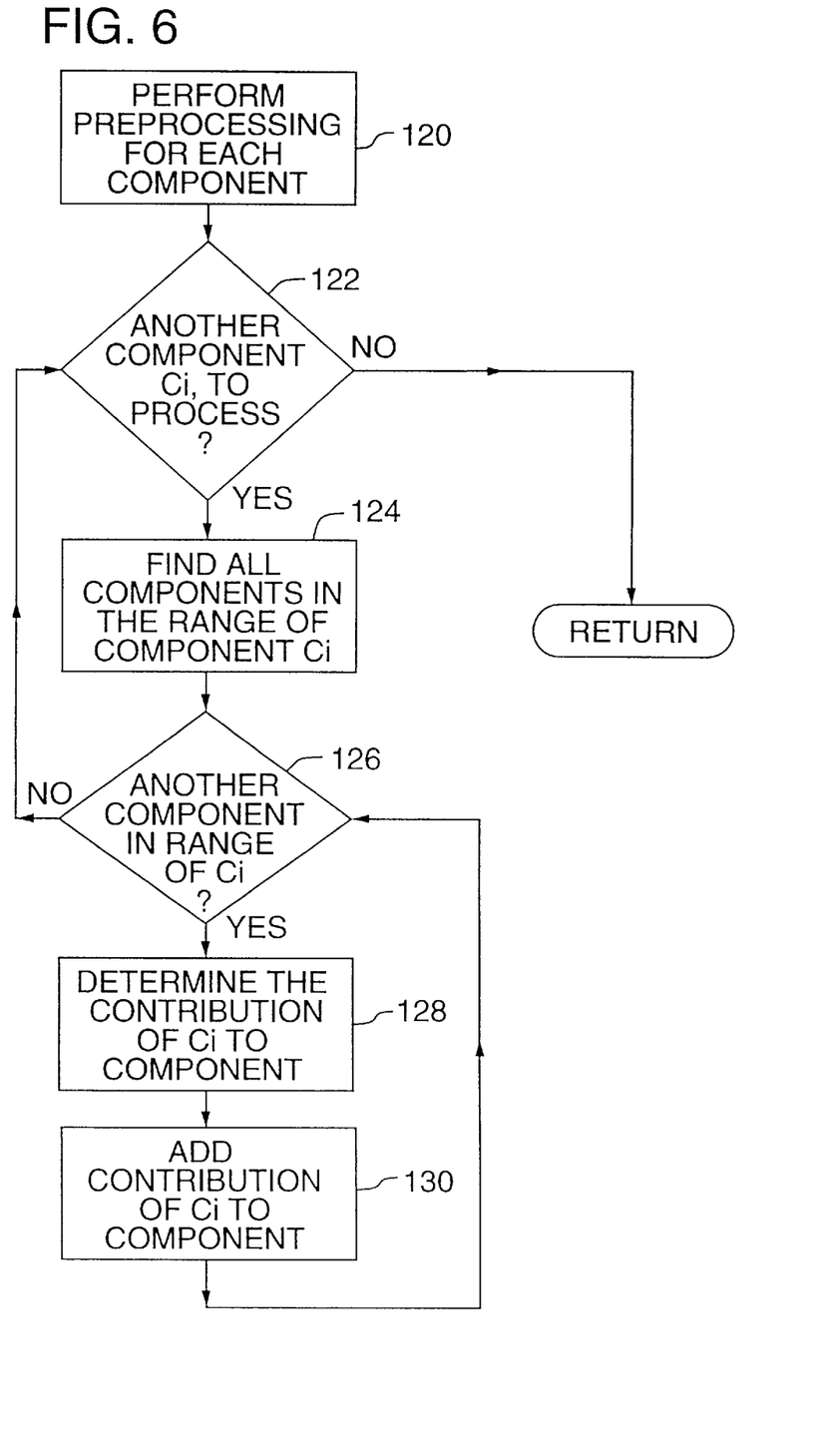
FIG. 6 is a flow diagram illustrating a process of calculating the junction temperature for each of the components in a design.

FIG. 6 is a flow diagram illustrating a process of calculating the junction temperature for each of the components in a design. FIG. 6 illustrates only one implementation of this process, and other alternative implementations are possible. In the illustrated embodiment, processing begins with a preprocessing step (120). Preprocessing includes retrieving a response function for a component at its specified location, and determining an initial junction temperature for the component from the response function.

Decision step (122) represents part of a loop for processing each component, $C_i$. The thermal engine loops on components until each has been processed.

In the next step (124), the thermal engine searches for all components in the range of the component being processed. Given a neighborhood for component $C_i$, the thermal engine determines which other components fall in this neighborhood. The thermal engine searches the neighborhood of a component to find components that fall within the neighborhood. As described above, this neighborhood can be a rectangular, triangulated space.

In one embodiment, the thermal engine conducts the search by performing a bin scan to find the components within the neighborhood of the component $C_i$. When the placement program loads a new design, the components in the design are placed in a bin structure. This bin structure can then be used to perform fast searches to find components located in the neighborhood of a given component.

The decision step (126) represents a loop for all of these components in the neighborhood. Within this loop, the contribution of $C_i$ to components in the neighborhood is computed (128), and then added to the respective components in the neighborhood (130). The contribution of $C_i$ to a component is computed by determining the value of the response function at a point representing the location of the component in the neighborhood. This value can be computed by interpolating from values in the response function. The resulting value is then added to the junction temperature for the component.

The junction temperature of a component is comprised of its own thermal contribution for a given location, calculated during a preprocessing phase, and the sum of contributions from other components, which have neighborhoods that overlap this component. The junction temperature for the component is maintained until something occurs during placement that can cause it to change. For instance, if the component is moved or one of its neighbors is moved, then the junction temperature of the component is recomputed.

For small changes in a placement, such as when the position of two components are swapped, an incremental calculation is more efficient than recomputing the junction temperature for each component. The incremental calculation takes advantage of the observation that for a typical change in placement, only information for a small subset of components needs to be updated. In one embodiment, the incremental calculation proceeds according to the steps illustrated in FIGS. 7–9.

Figure 7:
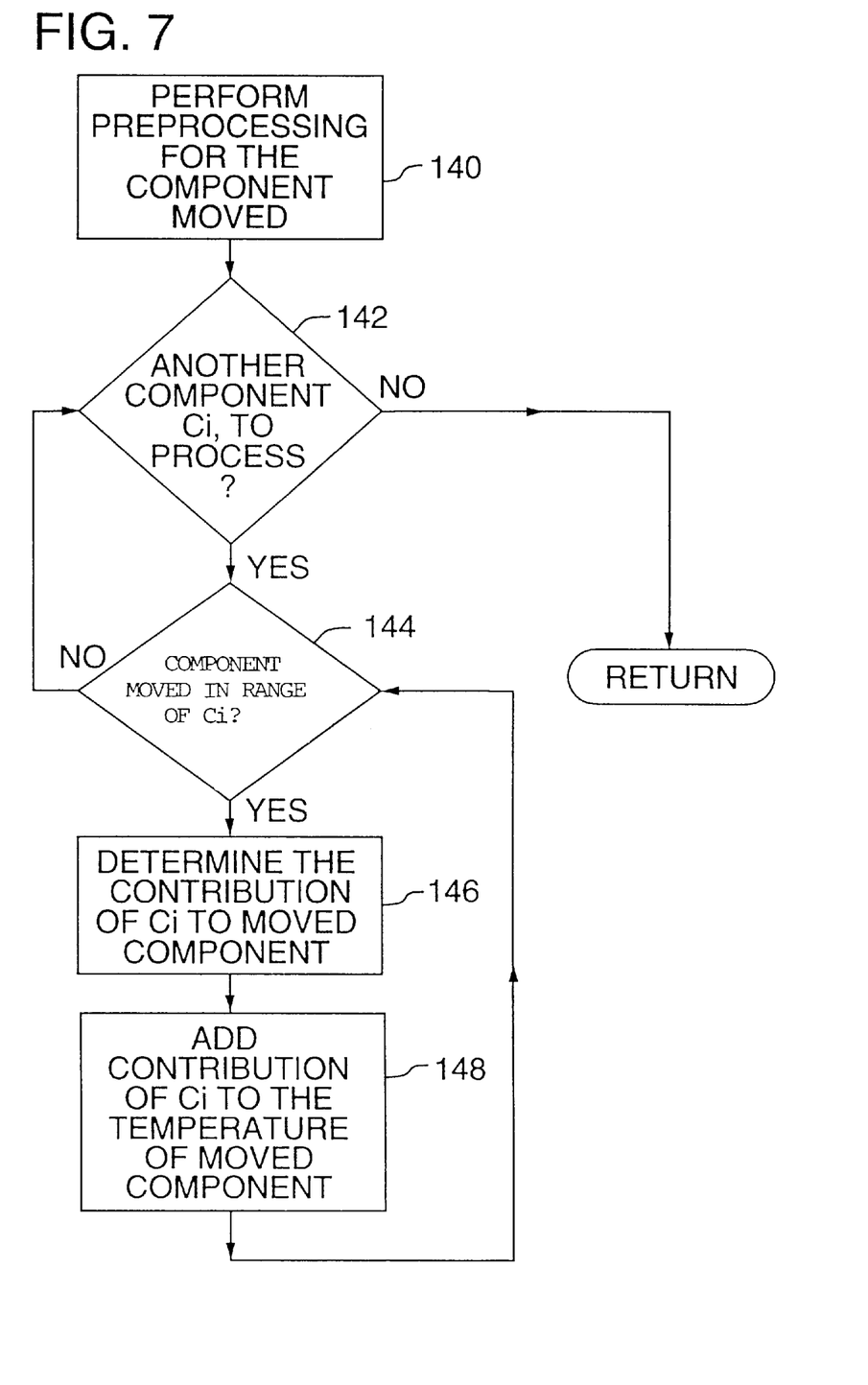
FIG. 7 is a flow diagram illustrating how the junction temperature of a moved component is computed in one embodiment.
Figure 8:
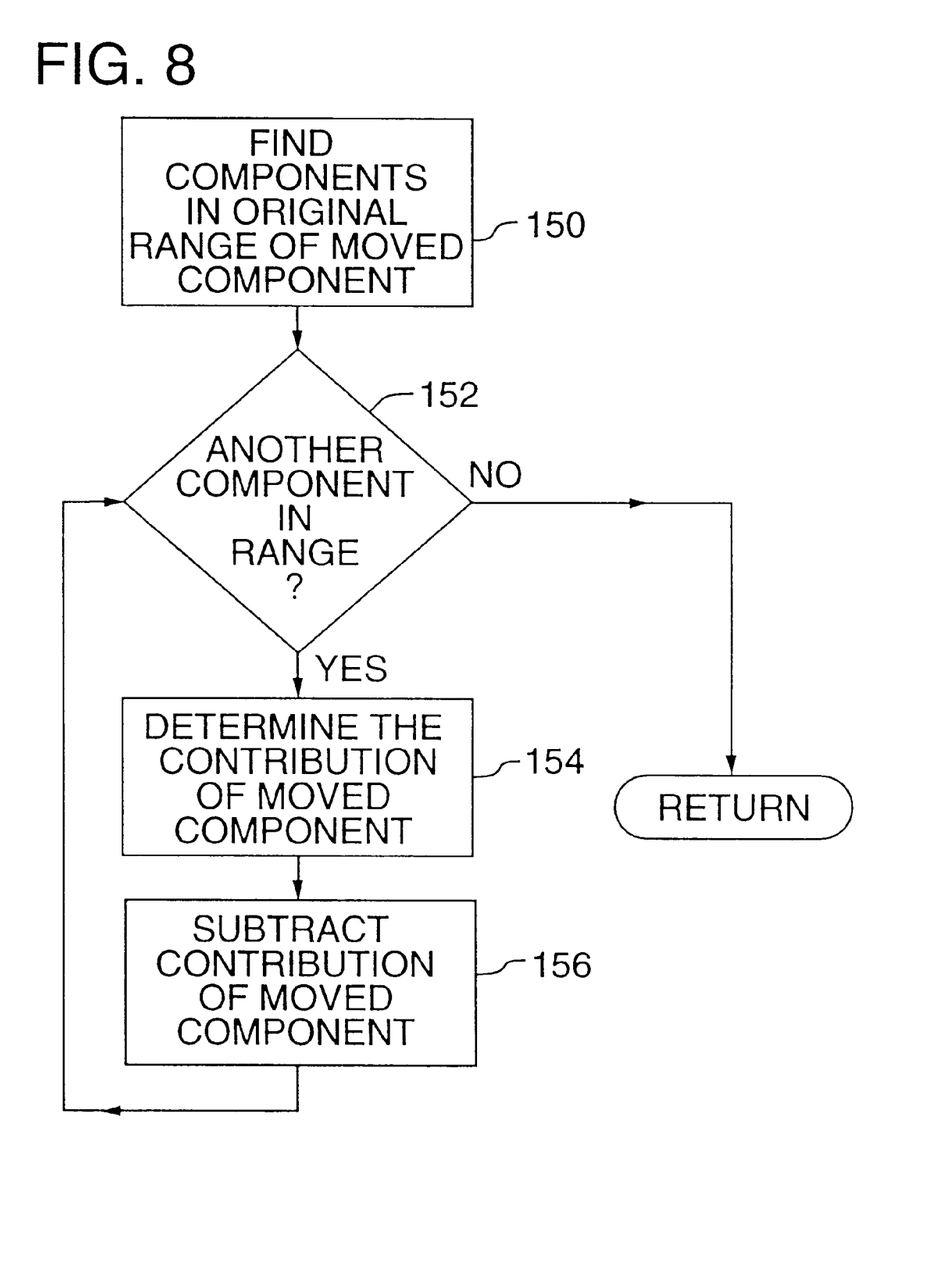
FIG. 8 is a flow diagram illustrating how the junction temperature is recomputed for components in the original range of the moved component in one embodiment.
Figure 9:
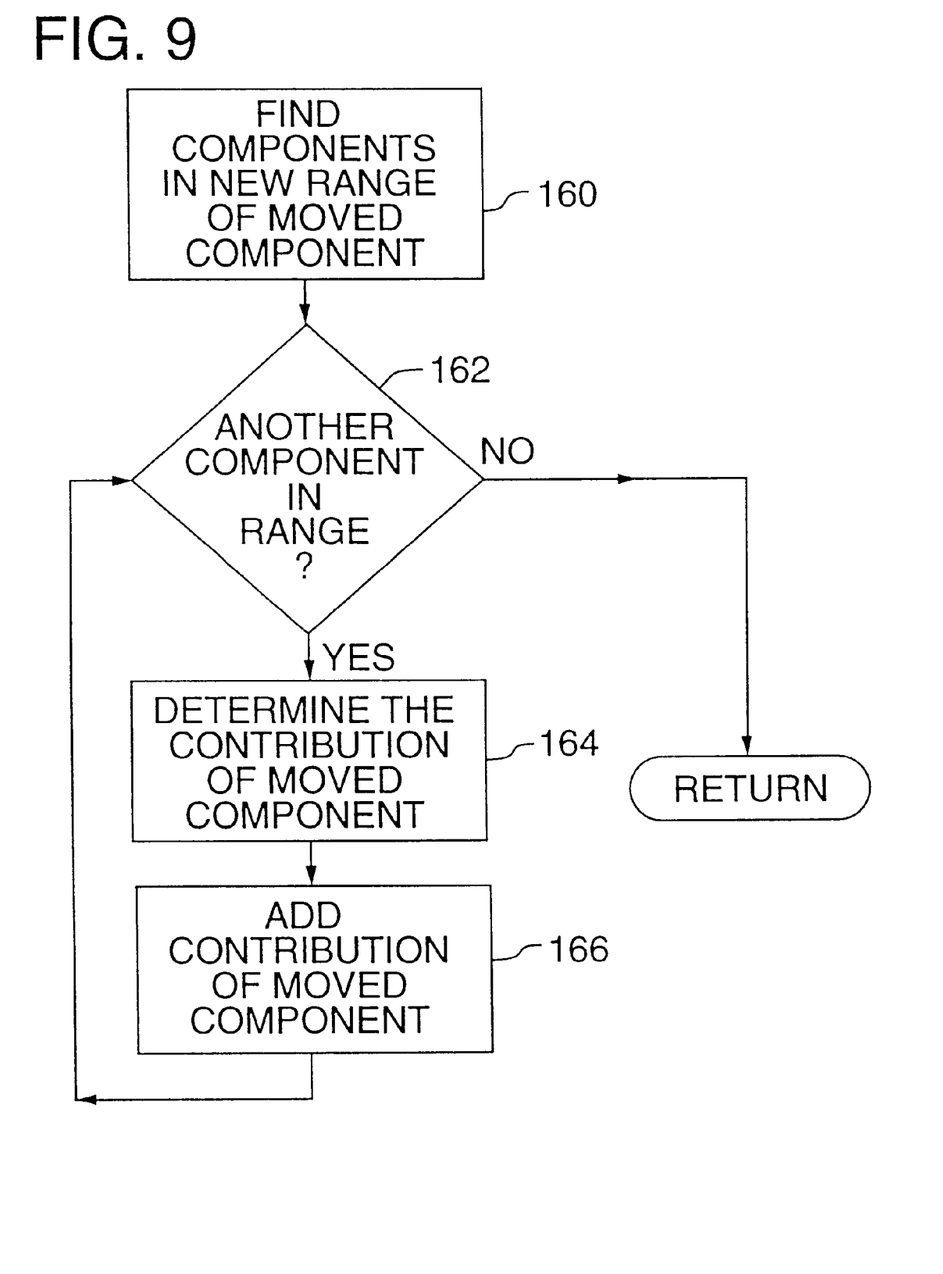
FIG. 9 is a flow diagram illustrating how the junction temperature for components in the new range of a moved component is computed in one embodiment.

For a component that has moved during placement, the junction temperature of the component is recomputed as shown in FIG. 7, the junction temperatures of its original neighboring components are recomputed as shown in FIG. 8, and the junction temperatures for its new neighboring components are recomputed as shown in FIG. 9.

FIG. 7 is a flow diagram illustrating how the junction temperature of a moved component is computed in one embodiment. First, the thermal engine performs preprocessing for the moved component (140). Then, the thermal engine loops on components in the design (142), each represented as component $C_i$ in this drawing. Within this loop the thermal engine determines whether the moved component is in the range of $C_i$ (144). If the moved component is in this range, then the thermal engine determines the contribution of $C_i$ to the moved component by searching the response function of $C_i$ and finding the triangular element that contains the moved component (146). The temperature at a location within the triangular element can then be computed using interpolation. This temperature is then added to the junction temperature of the moved component (148).

FIG. 8 is a flow diagram illustrating how the junction temperature is recomputed for components in the original range of the moved component in one embodiment. The process begins by finding the components in the original range or neighborhood of the moved component (150). Decision step 152 represents a loop on components within this neighborhood. The thermal engine computes the contribution in a similar manner as described above in connection with FIG. 7. Specifically, the thermal engine performs a search of temperature response of the moved component at its original position and finds the triangular element containing the point location of a component of interest (154). Once it is has computed the temperature at this point (154), the thermal engine subtracts the contribution of the moved component from the junction temperature of the component of interest (156). Steps 154 and 156 are repeated for the rest of the components in the original range of the moved component.

FIG. 9 is a flow diagram illustrating how the junction temperature for components in the new range of a moved component is computed in one embodiment. The thermal engine first finds the components in the new range of the moved component (160). Decision step 162 represents a loop on components within this range. Again, the thermal engine computes the contribution of the moved component in a manner similar to the process described in connection with FIG. 7. The thermal engine searches for a triangular element containing the point location of a component of interest and then finds the temperature at that point (164). This temperature is then added to the junction temperature of the component of interest (166). The thermal engine repeats steps 164–166 until each of the junction temperatures for each of the components in the new range of the moved component are adjusted.

There are a number of alternative ways to compute junction temperatures using the response function data. We have described a specific method to search and sum response function data, but other methods can be applied to perform this function. Having described methods for computing junction temperatures, we now return to FIG. 5 and describe the evaluation of thermal cost.

As illustrated in step 114 of FIG. 5, the thermal constraints are analyzed for the new placement of the components in the design. One constraint is whether a junction temperature of a component exceeds a predefined maximum value. If so, this component should be moved, or its neighbors moved so that the junction temperature is reduced.

Another constraint is a determination of how close each component is to its maximum temperature. The maximum and actual junction temperatures for each component are analyzed and a thermal cost is assigned based on this comparison. As the junction temperature approaches or exceeds its predefined maximum, the thermal cost increases. The individual costs can then be summed to find a total cost for a given placement. For automatic or interactive placement, this sum can be used to assess the relative merits of alternative placements. The placement with the lowest thermal cost is preferred with respect to the thermal constraints, but other design constraints can cause an alternative placement to be chosen.

While we have described an embodiment of our invention including some variations in detail, other variations can be made without departing from the scope of the invention. For instance, a variety of thermal analysis tools can be used to generate a thermal response function as described. Moreover, the thermal response function data can be processed and stored in alternative structures other than those constructed for a triangulated area. It is sufficient that the response functions be represented to support efficient searching and summation of thermal contribution from neighboring components. The manner in which thermal constraints are calculated during placement can be optimized depending on the placement technique employed in the placement program.

In view of the many possible embodiments to which the principles of our invention may be put, it is emphasized that the detailed embodiment described herein is illustrative only and should not be taken as limiting the scope of our invention. Rather, we claim as our invention all such embodiments as may come within the scope and spirit of the following claims and equivalents thereto.

We claim:

1. A method for thermal driven placement in a programmed computer system, the method comprising:
    separately computing thermal response function data for each component in a group of components for a plurality of locations on a placement surface; and
    placing the group of components on the placement surface in a first placement;
    computing a thermal contribution from a second component on a first component by finding a temperature value from the thermal response function data of the second component corresponding to a location of the first component;
    summing the temperature value from the thermal response function data of the second component with a temperature value of the first component to compute a calculated junction temperature of the first component; and
    comparing the calculated junction temperature with a predefined junction temperature to analyze whether the first placement satisfies a predefined thermal design constraint.

2. The method of claim 1 wherein the step of separately computing thermal response function data includes separately computing a temperature distribution for each different component in the group on the placement surface, and computing the temperature distribution for a plurality of locations on the placement surface.

3. The method of claim 1 further including:
    computing the thermal contribution from a plurality of components to a first component by finding temperature values from the thermal response function data of the plurality of components corresponding to a location of the first component; and
    summing the temperature values from the thermal response function data of the plurality of components with the temperature value of the first component to compute the calculated junction temperature.

4. The method of claim 3 further including:
    changing the location of the first component on the placement surface to a new location;
    in response to changing the location of the first component, computing the calculated junction temperature of the first component including:
        summing one or more temperature values from the thermal response data of other components corresponding to the new location of the first component; and
    comparing the calculated junction temperature with a maximum junction temperature to analyze whether a predefined thermal design constraint is satisfied.

5. The method of claim 1 further including:
    for a first moved component in the first placement, finding other components in an original range of the first moved component;
    computing contributions of the first moved component to the other components in the original range; and
    subtracting the contributions of the first moved component from junction temperatures of the other components in the original range.

6. The method of claim 1 further including:
    for a first moved component in the first placement, finding other components in a new range of the first moved component;
    computing contributions of the first moved component to the other components in the new range; and
    adding the contributions of the first moved component to junction temperatures of the other components in the new range.

7. The method of claim 1 including:
    placing the group of components in a series of different placements including the first placement;
    for at least one placement in the series of placements, computing junction temperatures for each of the components in the group including:
        for each component $C_i$ in the group, finding components located in a range of $C_i$; and
        computing thermal contributions of $C_i$ to the components located in the range of $C_i$.

8. The method of claim 1 including:
    placing the group of components in a series of different placements including the first placement;
    for at least one placement in the series of placements, computing junction temperatures for a subset of the components in the group affected by a moved component, including:
        for each component $C_i$ in the group, finding whether the moved component is located in a range of $C_i$; and
        if so, computing a thermal contribution of $C_i$ to the moved component.

9. A method for thermal driven placement in a programmed computer system, the method comprising:
    separately computing temperature distribution data for each component in a group of components for a plurality of locations on a placement surface;
    storing the temperature distribution data comprising temperature values and corresponding location data in memory of a programmed computer system;
    placing components on the placement surface including:
        for a first placement, computing a junction temperature of a component in the group by finding temperature values in the temperature distribution data for other components that correspond to the location of the component, and summing the temperature values to find the contribution of the other components to the junction temperature;
        comparing the junction temperature with a maximum junction temperature to analyze whether the first placement satisfies a thermal design constraint.

10. The method of claim 9 further including the steps of:
    performing a triangulation on a temperature response function in the temperature distribution data; and
    using triangulation data resulting from the triangulation to find a first temperature value at a corresponding component location in the temperature response function.

11. The method of claim 9 further including the step of:
    placing the group of components in a bin structure; and
    searching the bin structure to determine whether a first component is located in the range of thermal affect of one or more other components in the group.

12. The method of claim 11 including:
    placing the components in a series of different placements including the first placement;
    for each placement in the series, computing junction temperatures for at least a subset of the components in the group; and
    comparing the junction temperatures with a maximum junction temperatures corresponding to the components in the subset to analyze whether the series of different placements satisfy a thermal design constraint.

13. A computer-readable medium on which is stored at least one computer program for supporting thermal driven placement, said at least one computer program comprising instructions, which when executed by a computer, perform the steps of:

separately computing thermal response function data for each component in a group of components for a plurality of locations on a placement surface; and placing the group of components on the placement surface in a first placement;

computing the thermal contribution from a second component on a first component by finding a temperature value from the thermal response function data of the second component corresponding to a location of the first component;

summing the temperature value from the thermal response function data of the second component with a temperature value of the first component to compute a calculated junction temperature; and comparing the calculated junction temperature with a predefined junction temperature to analyze whether the first placement satisfies a predefined thermal design constraint.

14. The computer-readable medium of claim 13 on which is stored the at least one computer program for performing thermal driven placement, said at least one computer program comprising instructions, wherein the step of separately computing thermal response function data includes separately computing a temperature distribution for each different component in the group on the placement surface, and computing the temperature distribution for a plurality of locations on the placement surface.

15. The computer-readable medium of claim 13 on which is stored the at least one computer program for performing thermal driven placement, said at least one computer program further comprising instructions for performing the steps of:

computing the thermal contribution from a plurality of components to the first component by finding temperature values from the thermal response function data of the plurality of components corresponding to a location of the first component; and summing the temperature values from the thermal response function data of the plurality of components with a temperature value of the first component to compute the calculated junction temperature.

16. The computer-readable medium of claim 15 on which is stored the at least one computer program for performing thermal driven placement, said at least one computer program further comprising instructions for performing the steps of:

changing the location of the first component on the placement surface to a new location;

in response to changing the location of the first component, computing the junction temperature of the first component including:

summing one or more temperature values from the thermal response data of other components corresponding to the new location of the first component; and comparing the junction temperature with the predefined junction temperature to analyze whether a predefined thermal design constraint is satisfied.

17. The computer-readable medium of claim 13 on which is stored the at least one computer program for performing thermal driven placement, said at least one computer program further comprising instructions for performing the steps of:

for a first moved component in the first placement, finding other components in an original range of the first moved component;

computing contributions of the first moved component to the other components in the original range; and subtracting the contributions of the first moved component from junction temperatures of the other components in the original range.

18. The computer-readable medium of claim 13 on which is stored the at least one computer program for performing thermal driven placement, said at least one computer program further comprising instructions for performing the steps of:

for a first moved component in the first placement, finding other components in a new range of the first moved component;

computing contributions of the first moved component to the other components in the new range; and adding the contributions of the first moved component to junction temperatures of the other components in the new range.

19. The computer-readable medium of claim 13 on which is stored the at least one computer program for performing thermal driven placement, said at least one computer program further comprising instructions for performing the steps of:

placing the group of components in a series of different placements including the first placement;

for at least one placement in the series of placements, computing junction temperatures for each of the components in the group including:

for each component $C_i$ in the group, finding components located in a range of $C_j$; and computing thermal contributions of $C_i$ to the components located in the range of $C_j$.

20. The computer-readable medium of claim 13 on which is stored the at least one computer program for performing thermal driven placement, said at least one computer program further comprising instructions for performing the steps of:

placing the group of components in a series of different placements including the first placement;

for at least one placement in the series of placements, computing junction temperatures for a subset of the components in the group affected by a moved component, including:

for each component $C_i$ in the group, finding whether the moved component is located in a range of $C_j$; and if so, computing a thermal contribution of $C_i$ to the moved component.

* * * * *